United States Patent [19]

Chakravorty et al.

[11] Patent Number: 5,149,615
[45] Date of Patent: Sep. 22, 1992

[54] METHOD FOR PRODUCING A PLANAR SURFACE ON WHICH A CONDUCTIVE LAYER CAN BE APPLIED

[75] Inventors: Kishore K. Chakravorty, Issaquah; Minas H. Tanielian, Bellevue, both of Wash.

[73] Assignee: The Boeing Company, Seattle, Wash.

[21] Appl. No.: 638,802

[22] Filed: Jan. 8, 1991

[51] Int. Cl.⁵ .................................................. G03C 1/74
[52] U.S. Cl. ...................................... 430/313; 430/314; 430/317; 430/327; 430/331; 427/96
[58] Field of Search ............... 430/313, 315, 317, 327, 430/330, 331, 314; 156/643, 644, 650, 659.1; 427/96

[56] References Cited

U.S. PATENT DOCUMENTS 4,642,162  2/1987  Brownell .......................... 430/314

OTHER PUBLICATIONS

Chakravorty et al., "High-Density Interconnection Using Photosensitive Polyimide and Electroplated Copper Conductor Lines," Reprinted from *IEEE Transactions on Components, Hybrids, and Manufacturing Technology*, vol. 13, No. 1, Mar. 1990, pp. 200–206.
Chakravorty et al., "Photosensitive Polyimide as a Dielectric in High Density Thin Film Copper-Polyimide Interconnect Structures," Reprinted from *Journal of the Electrochemical Society*, vol. 137, No. 3, Mar. 1990, pp. 961–966.
Chao et al., "Multi-Layer Thin-Film Substrates for Multi-Chip Packaging," *IEEE Transactions on Components, Hybrids, and Manufacturing Technology*, vol. 12, No. 2, Jun. 1989, pp. 180–184.
Dishon et al., "Etching Results and Discussion," *Journal of Electronic Materials*, vol. 18, No. 2, 1989, pp. 295–299.
Endo et al., "Material and Processing Technologies of Polyimide for Advanced Electronic Devices," *J. Electrochem. Soc.: Solid-State Science and Technology*, vol. 134, No. 10, Oct. 1987, pp. 2522–2527.
Ho et al., "The Thin-Film Module as a High-Performance Semiconductor Package," *IBM J. Res. Develop.*, vol. 26, No. 3, May 1982, pp. 286–296.

(List continued on next page.)

*Primary Examiner*—Marion E. McCamish
*Assistant Examiner*—Kathleen Duda
*Attorney, Agent, or Firm*—Christensen, O'Connor, Johnson & Kindness

[57] ABSTRACT

A method for producing a planar surface on which conductive traces can be formed to fabricate a multilayer integrated circuit. In this method, a substrate (20) serves as a base for the formation of conductive traces including copper conductors (30). These conductors are preferably bonded to an adhesion layer (22) and coated with a corrosion barrier (31). A first polyimide coating (34) is spin coated over the substrate and the copper conductors, leaving an undulating surface. Portions of the first polyimide coating lying above the copper conductors are removed, and the resulting surface is coated with a second polyimide coating (44). The polyimide comprising the first and second coatings is selected for its characteristic ability to partially dissolve a previously applied layer of the material, so that the two layers combine, thereby leveling out an non-planar irregularities existing in the first layer. The resulting planar surface forms a base for application of subsequently applied copper conductors (54), which are connected to the previously applied copper conductors at vias, photolithographically formed in the second polyimide coating. Additional layers of copper conductors can be applied to the planar surface as the process is repeated.

20 Claims, 4 Drawing Sheets

OTHER PUBLICATIONS

Iwasaki et al., "A Pillar-Shaped Via Structure in a Cu-Polyimide Multilayer Substrate," *IEEE Transactions on Components, Hybrids, and Manufacturing Technology*, vol. 13, No. 2, Jun. 1990, pp. 440-443.

Jensen et al., "Copper/Polyimide Materials System for High Performance Packaging," *IEEE Transactions on Components, Hybrids, and Manufacturing Technology*, vol. CHMT-7, No. 4, Dec. 1984, pp. 384-393.

Johnson et al., "Multichip Thin-Film Technology on Silicon," *IEEE Transactioins on Components, Hybrids, and Manufacturing Technology*, vol. 12, No. 2, Jun. 1989, pp. 185-194.

Majid et al., "The Parylene-Aluminum Multilayer Interconnection System for Wafer Scale Integration and Wafer Scale Hybrid Packaging," *Journal of Electronic Materials*, vol. 18, No. 2, 1989, pp. 301-311.

McDonald et al., "Multilevel interconnections for wafer scale integration," *J. Vac. Sci. Technol.*, vol. A 4, No. 6, Nov./Dec. 1986, pp. 3127-3138.

Pan et al., "A Planar Approach to High Density Copper-Polyimide Interconnect Fabrication," Presented at the IEPS Eighth Annual International Electronics Packaging Conference and the Electrical/Electronic Packaging Exhibition '88, Dallas Marriott Quorum, Dallas, Tex., Nov. 7-10, 1988, p. 17.

Umezaki et al., "Planar Process for 16 Mb Bubble Memory Devices Using Thermal Reflow-Type Polyimide," *J. Electrochem. Soc.*, vol. 136, No. 8, Aug. 1989, pp. 2357-2360.

METHOD FOR PRODUCING A PLANAR SURFACE ON WHICH A CONDUCTIVE LAYER CAN BE APPLIED

TECHNICAL FIELD

This invention generally pertains to a method for making a multi-layer circuit, and more specifically, to a method for producing a surface on which a conductive layer can be formed to make such a circuit.

BACKGROUND OF THE INVENTION

Development of hybrid wafer scale integrated circuits has been directed toward further reducing the size of the functional circuitry on a single substrate and providing interconnection capability in the circuitry that is compatible with propagation of high-speed signals. As a consequence of these requirments, conductor densities in large scale integrated (LSI) and hybrid circuits have reached a limit for single-layer topology, creating a need for practical methods useful in forming multi-layer circuits in which planes of interconnected conductive traces are built up on a substrate.

A multi-layer circuit comprises at least two layers of conductive traces, usually formed so that the primary signal propagation directions in adjacent layers are orthogonal to each other. In addition to the layers for conveying signals, the typical circuit of this type requires several additional layers for conveying power to the components comprising the circuit. Each layer of conductive traces is separated from its adjacent layers by a dielectric coating. Conductive traces for the second and successive layers are formed on the dielectric coating covering the preceding layer of conductive traces, with inter-layer connections between the conductive traces occurring at vias that extend transversely through the dielectric coating separating adjacent layers.

Overlaying a series of closely-spaced, parallel conductive traces applied to a substrate with an electrically insulating dielectric coating normally produces a washboard surface on which subsequent layers of circuitry must be formed, since the dielectric coating tends to follow the undulations of the surface to which it is applied as it flows over and between adjacent conductive traces. However, successful fabrication of high-density, multi-layer circuits requires a relatively planar underlying surface upon which to form the next layer of conductive traces. The conventional method for providing a smooth surface calls for applying four to five additional coats of dielectric material over each layer of conductive traces; yet, in most attempts, the resulting surface is not planar. Each successive dielectric coat formed using conventional materials and techniques tends to have a generally constant thickness, and thus conforms to the undulating surface of the previously formed circuit traces. Rather than filling in the low areas between conductive traces, each coat follows the surface contour of the preceding coat. It has been suggested that the wafer on which the multi-layer circuit is being formed can be mechanically polished to smooth out these undulations in the dielectric coating. However, due to the production of particulates and likely damage to the micro circuitry that usually results from such abrasive techniques, this approach is generally impractical.

Accordingly, there is a need for developing a method for producing a planar surface of a dielectric coating on which a conductive trace can be applied to form successive layers of a multi-layer circuit. The planar surface should be provided without applying many coats of dielectric material between each layer of conductive traces and without resorting to mechanical abrasion to smooth the surface.

SUMMARY OF THE INVENTION

In accordance with this invention, a method of producing a planar surface on which a successive conductor layer can be formed in a multi-layer circuit is provided. The method includes the steps of forming a conductive trace on a substrate and applying a first coat of a dielectric material over the conductive trace and the substrate. A portion of the dielectric material that overlies the conductive trace is removed, and a second layer of the dielectric material is applied over the conductive trace and the first coat of the material. This second coat of the dielectric material at least partially dissolves and combines with the first coat, thereby leveling out any non-planar irregularities in the first coat, and leaving a substantially planar surface. A portion of the second coat of the dielectric material overlying the conductive trace is then removed where an electrically conductive via is to be formed between the conductive trace already formed on the substrate and a subsequent conductive trace. The substantially planar surface of the combined first coat and second coat thus provided serves as a base for forming the subsequent conductive trace. These steps are repeated for each of the remaining layers of conductive traces comprising the circuit, and electrical continuity between conductive traces in different layers is provided where the dielectric material of the second coat is removed to form the vias.

The dielectric material preferably comprises a polyimide that is selected for its characteristic ability to combine and level a previously applied non-planar coat of the polyimide.

The step of forming the conductive trace can include the step of applying an adhesion layer before applying the conductive trace. Specifically, if the conductive trace is formed by plating, the step of forming the conductive trace can further include the step of applying a seed layer prior to plating the conductive trace on the seed layer.

The steps of applying the first and the second coats of dielectric material preferably include the steps of spinning the substrate to spread the dielectric material using centrifugal force. Alternatively, this material may be applied by spraying. The polyimide applied to form the first and second coats is preferably cured by heating the material to an elevated temperature.

The steps of removing the first and second coatings of dielectric material comprises the steps of lithographically photopatterning the coatings to define areas of the coating that are to be removed, and dissolving away the dielectric material in those areas.

DESCRIPTION OF THE PREFERRED EMBODIMENTS

Figure 8:
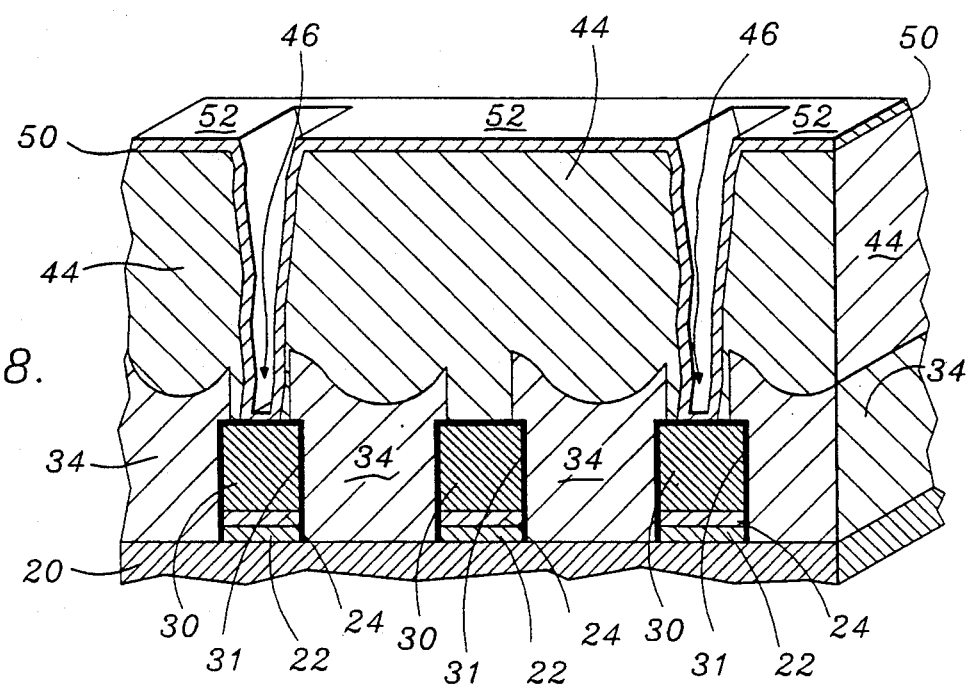
FIG. 8 is an isometric view of the circuit, illustrating how the combined first and second coats level out to form a substantially planar surface to which a plating seed film is applied.
Figure 9:
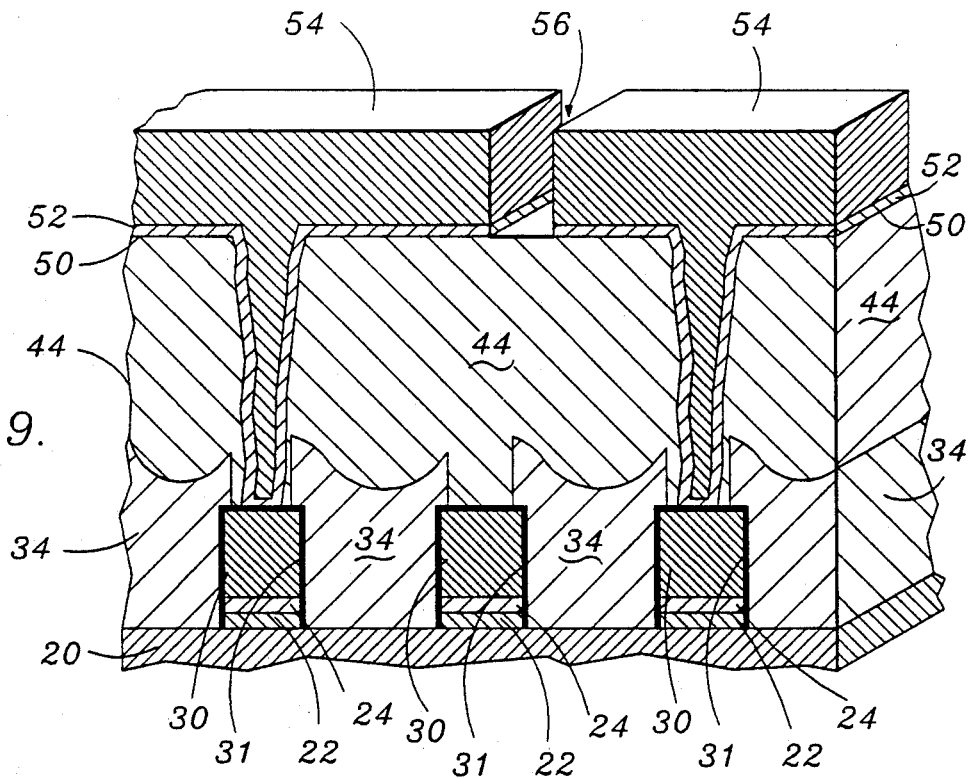
FIG. 9 is an isometric view of the circuit after a second layer of conductive traces is formed over the seed layer.
Figure 10:
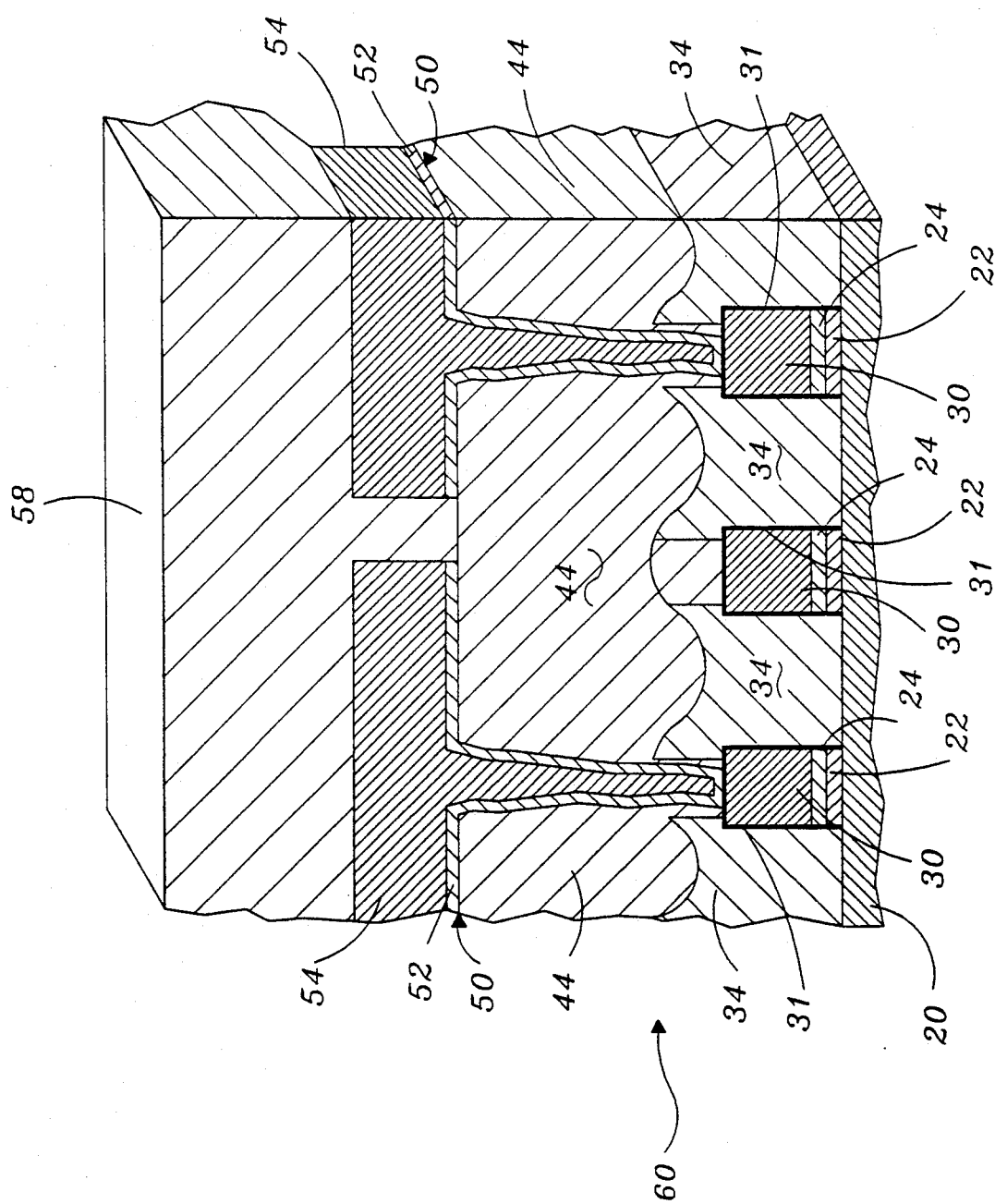
FIG. 10 is an isometric view of the circuit showing the substantially planar surface resulting from repeated applications of two coats of the dielectric material.

A process for fabricating a multi-layer integrated circuit 60 is illustrated generally in FIGS. 1–10. Each of these figures illustrates in sequence, successive steps in the fabrication of multi-layer integrated circuit 60, which is shown in FIG. 10.

Figure 1:
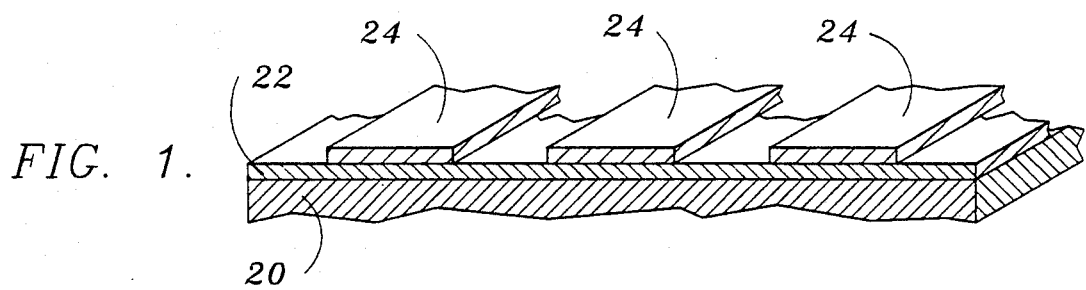
FIG. 1 is an isometric view of a cut-away portion of a substrate prepared for forming conductive traces.

As shown in FIG. 1, a first step in forming integrated circuit 60 begins with a substrate 20, which preferably comprises a silicon wafer. The first step of the fabrication sequence consists of deposition of an electroplating seed layer on substrate 20 having a typical thickness of 500–4,000 A. In the preferred embodiment, the electroplating seed layer comprises a chromium adhesion layer 22, followed by a gold plating seed layer 24. The adhesion layer provides a more effective bonding surface for the gold plating seed layer. Gold plating seed layer 24 is then photolithographically patterned so that it generally defines the pattern of conductive traces that are subsequently to be applied to substrate 20. In the portion of integrated circuit 60 illustrated in FIG. 1, gold plating seed layer 24 takes the form of a plurality of generally parallel strips that are spaced apart from each other approximately 10–25 micrometers, and which have a width of approximately 10–25 micrometers. The purpose of gold plating seed layer 24 is to facilitate electroplating deposition of conductive traces on substrate 20.

Figure 2:
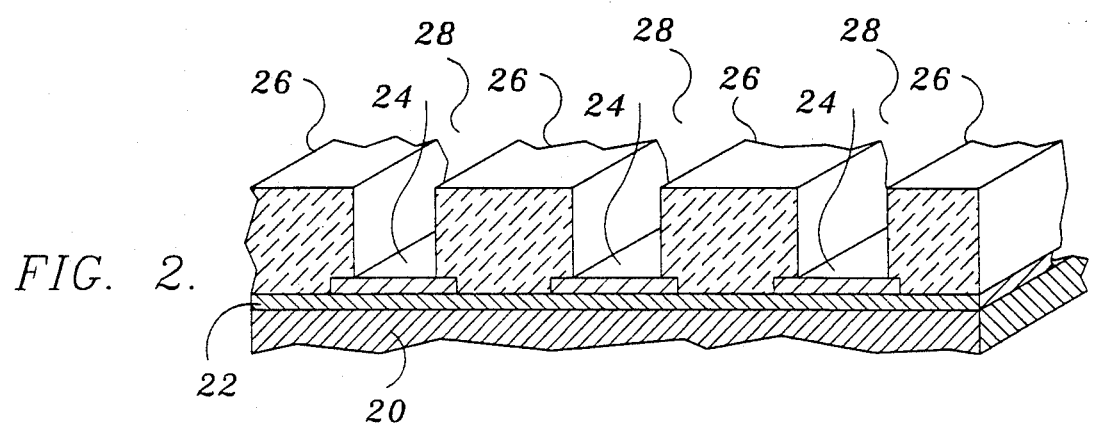
FIG. 2 is an isometric view of the substrate after a pattern for the conductive traces has been formed with a photoresist material.
Figure 3:
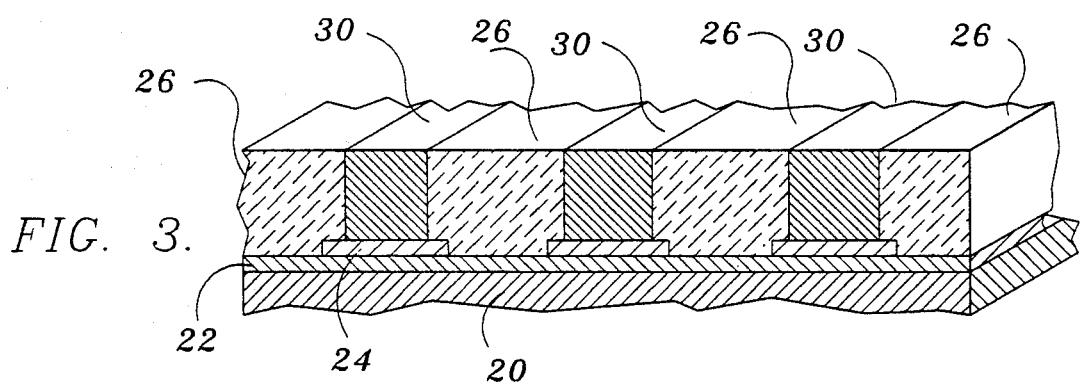
FIG. 3 is an isometric view of the substrate showing conductive traces in one layer.

In FIG. 2, a conventional photoresist material 26 is applied over both the chromium adhesion layer and the gold plating seed layer. Subsequently, photoresist material 26 is also photolithographically patterned, leaving a plurality of trenches 28 that are disposed immediately above and generally in conformance to the photolithographically patterned gold plating seed layer 24. Trenches 28 thus define the lateral and longitudinal extent of the electroplated copper conductors 30 that are applied, as shown in FIG. 3. It should be noted that alternative methods can be used to form conductive traces on substrate 20 and that gold plating seed layer 24 is only required if copper conductors 30 are formed by an electroplating process. Alternatively, copper conductors 30 can be formed by sputtering, screen printing, ion deposition, or by electroless plating.

Figure 4:
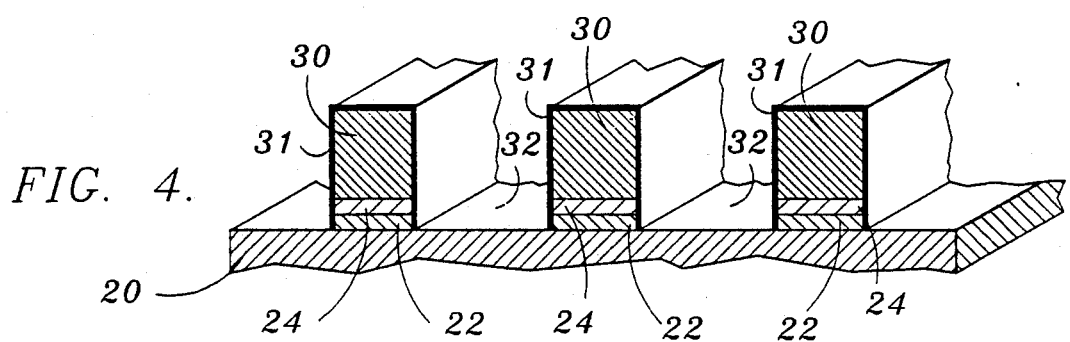
FIG. 4 is an isometric view of the substrate illustrating the conductive traces after the photoresist material is removed and the conductive traces are coated with a passivation material.

After copper conductors 30 have been formed in conformance with the side walls of trenches 28, photoresist material 26 is no longer required and is stripped off using acetone or other well-known photoresist stripping solvents. Since chromium adhesion layer 22 forms a short circuit between copper conductors 30, it must be removed where it extends beyond the edges of each copper conductor, as shown in FIG. 4. To remove chromium adhesion layer 22, substrate 20 is exposed to an etching medium that selectively etches chromium, leaving behind copper conductors 30. For this purpose, a dilute solution of hydrochloric acid activated with aluminum can be used. Alternatively, a photolithographic technique can be used to remove chromium adhesion layer 22 where it extends between copper conductors 30. Following removal of the chromium adhesion layer, copper conductors 30 are no longer shorted and thus comprise separate conductive traces on substrate 20. Thereafter, a titanium/nickel passivation layer 31 is applied over the copper conductors to prevent any chemical interaction with a first polyimide coating 34 that is next applied.

Figure 5:
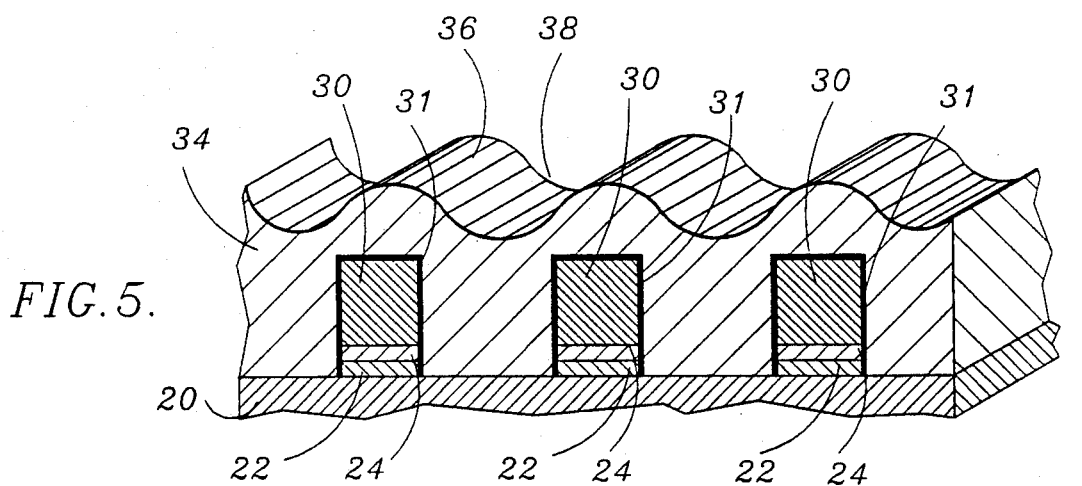
FIG. 5 is an isometric view of the substrate after a first layer of dielectric material is applied.

In FIG. 5, first polyimide coating 34 has been applied to substrate 20 and disbursed over copper conductors 30. Application of first polyimide layer 34 is achieved by spin coating, a process wherein an appropriate amount of the polyimide in liquid form is placed approximately at the center of the substrate and spread using centrifugal force as the substrate and a table (not shown) on which it rests are spun about its central axis. As will be apparent from FIG. 5, when thus applied, first polyimide coating 34 fills in the gaps between each copper conductor 30 and forms a somewhat planar surface. However, when the polyimide is subsequently heated to cure the composition, the solvent evaporates causing shrinkage in film thickness thus resulting in a relatively non-planar surface, generally forming "hills" 36 above each copper conductor 30, and "valleys" 38 between each copper conductor. Alternatively, first polyimide coating 34 can be applied by spraying the material on the copper conductors and substrate 20. In either case, due to the polyimide shrinkage characteristics, the result after the coating is cured is a non-planar surface, having irregularities that exceed the requirements of a multi-layer integrated circuit. As noted previously, the prior art teaches that either a plurality of additional layers (at least three layers) of the polyimide can be applied to first polyimide coating 34 and cured in an attempt to provide a planar surface, or the undulating surface of the first polyimide layer can be machanically polished. Either technique can provide an acceptable planar surface for fabrication of a multi-layer integrated circuit, but the cost and complexity of these techniques cause them to be undesirable. In contrast, the present invention provides for selection of first polyimide coating 34 for its characteristic ability to dissolve as a second polyimide layer of the same material is subsequently applied, such that the resulting surface becomes relatively planar. In the preferred embodiment, a polyimide meeting these requirements is PROBIMIDE 414 TM, which is available from Cibe-Geigy Corporation; however, it is believed that other types of polyimides may have similar characteristics.

When initially applied, first polyimide coating 34 includes a substantial amount of solvent. After the first polyimide layer is applied by spin coating or spraying, substrate 20 is baked at approximately 125° C. for approximately 30 minutes. The baking evaporates most of the solvent, curing the coating and leaving the undulating surface shown in FIG. 5.

During the next process step, first polyimide coating 34 is photolithographically patterned and most of the first polyimide coating disposed above copper conductors 30 is removed by photo development. Alternatively, a plasma etching process, wet/dry etching process, or a focused energy beam ablation process can be used to remove the portion of first polyimide coating 34 lying above copper conductors 30.

Figure 6:
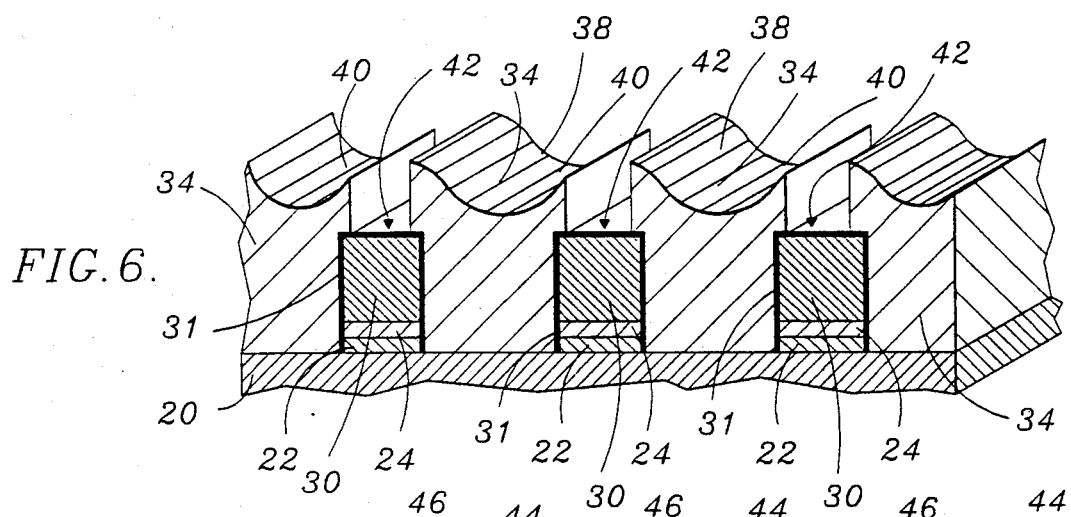
FIG. 6 is an isometric view of the substrate and circuit structure after a portion of the dielectric material overlying the conductive traces has been dissolved away, leaving a non-planar surface.

FIG. 6 shows the result of this step, wherein the highest portions of hills 36 have been eliminated, leaving relatively high wings 40 disposed above each side of copper conductors 30. Wings 40 are separated by a clear area 42 disposed immediately above copper conductors 30.

Figure 7:
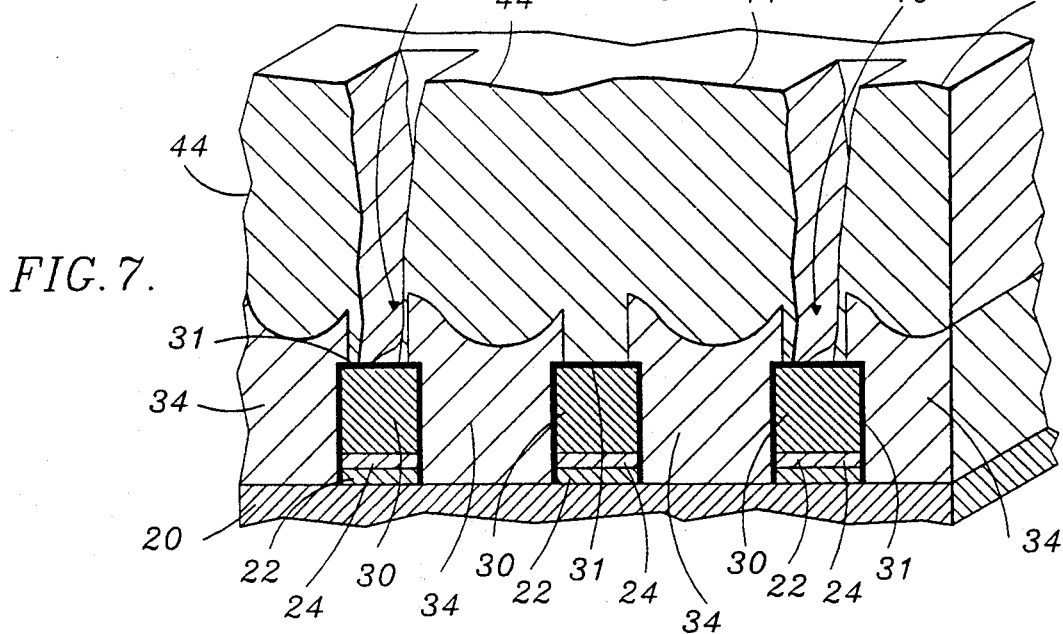
FIG. 7 is an isometric view showing the initial relationship of the first coat and a second coat of dielectric material after a portion of the second coat has been removed to form vias.

As shown in FIG. 7, a second polyimide coating 44 having approximately the same thickness as first polyimide coating 34 is applied by spin coating or spraying the material so that it overlies the upper surface of the first polyimide coating. As second polyimide coating 44 is applied, the solvent it contains at least partially dissolves first polyimide coating 34, allowing the first and second coatings to combine, producing an integral dielectric coating that levels out, forming a substantially planar surface. This surface is then photopatterned to delineate each of the vias or inter-layer conductive paths required between adjacent layers of the copper conductors as a subsequent copper conductor is applied over second polyimide coating 44. Vias 46 are formed by removing a portion of the second polyimide coating in accordance with a predefined photolithographic pattern, each via comprising a generally vertical well that provides access to the top of the previously-formed copper conductors 30. The second polyimide coating, which has integrally combined with the first polyimide coating, is baked at a temperature up to approximately 400° C. to cure it, during which time the solvent within the second polyimide coating substantially evaporates.

In FIG. 8, a substantially planar surface 50 formed by the leveling effect of the second polyimide coating 44 is then coated with an electroplating seed layer 52 in preparation for electroplating a successive layer of conductive traces.

As shown in FIG. 9, a plurality of copper conductors 54 are formed on electroplating seed layer 52, generally using the same techniques as used to form copper conductors 30 in the preceding layer. However, copper conductors 54 extend vertically down into each of the vias 46 that were defined within second polyimide coating 44. At each via, copper conductor 54 makes electrical connection with one of the underlying copper conductors 30, as required for the particular circuit being developed on substrate 20.

The above-described process is replicated for each successive layer, producing a combined first and second polyimide coating 58 overlying copper conductors 54, as shown in FIG. 10. The upper surface of combined first and second polyimide coating 58 is substantially planar, providing a surface for yet another layer of copper conductors to be applied, if desired.

The technique of applying a first polyimide coating that is subsequently leveled to form a planar surface by application of a second polyimide coating clearly depends upon using a type of polyimide having the ability to dissolve and homogenize with a previously applied coating of the same material. It appears that the solvent in the second polyimide coating equilibrates throughout the second coating and at least a portion of the previously applied polyimide coating. As a result, a leveling of non-planar features in the previously applied polyimide coating occurs. Use of this particular type of polyimide produces remarkably improved results compared to prior art attempts to form a planar surface using a plurality of polyimide coating not having this characteristic ability.

While the present invention has been described in respect to a preferred embodiment and modifications thereto, those of ordinary skill in the art will appreciate that further variations can be made within the scope of the claims that follow. Accordingly, it is not intended that the description of the preferred embodiment in any way limit the scope of the invention, but instead that the scope of invention be determined entirely by reference to the claims.

The embodiments of the invention in which an exclusive property or privilege is claimed are defined as follows:

1. A method of producing a planar surface on which successive conductor layers can be formed in a multi-layer circuit, comprising the steps of:
    a. forming a conductive trace on a substrate;
    b. applying a first coat of a dielectric material over the conductive trace and the substrate;
    c. removing a portion of the dielectric material that overlies the conductive trace;
    d. applying a second coat of the dielectric material over the conductive trace and over the first coat of the dielectric material, the second coat at least partially dissolving and combining with the first coat, thereby leveling out any non-planar irregularities in the first coat and leaving a substantially planar surface; and
    e. removing a portion of the second coat of the dielectric material overlying the conductive trace where an electrically conductive via is to be formed between the conductive trace already formed on the substrate and a subsequent conductive trace, the substantially planar surface of the combined first coat and second coat providing a base for forming the subsequent conductive trace.

2. The method of claim 1, wherein the dielectric material comprises a polyimide that is selected for its characteristic ability to combine with and level a previously applied non-planar coat of the polyimide.

3. The method of claim 2, wherein the steps of applying the first and second coats of polyimide include the step of curing the polyimide by heating it to an elevated temperature.

4. The method of claim 1, further comprising the steps of repeating steps (a) through (e) for each successive layer of the multi-layer circuit, wherein successive conductive traces are formed on the substantially planar surface resulting from the combined first and second coat of dielectric material applied, and electrical continuity is provided between the successive conductive traces where the second coat of dielectric material is removed to form the via into which the successive conductive traces extend.

5. The method of claim 1, wherein the step of forming the conductive trace includes the step of applying an adhesion layer before applying the conductive trace.

6. The method of claim 1, wherein if the conductive trace is formed by plating, the step of forming the conductive trace includes the step of applying a seed layer prior to plating the conductive trace on the seed layer.

7. The method of claim 1, wherein the steps of applying the first and second coats of dielectric material each comprise the step of spinning the substrate to spread the dielectric material using centrifugal force.

8. The method of claim 1, wherein the steps of applying the first and second coats of dielectric material comprise the step of spraying the dielectric material.

9. The method of claim 1, wherein the steps of removing the first and second coatings of dielectric material overlying the conductive trace each comprise the steps of photolithographically patterning the coatings to define areas that are to be removed and chemically removing the dielectric material in those areas.

10. A method of forming a substantially planar surface on which a conductive trace can be applied to build up successive layers of a multi-layer circuit, comprising the steps of:
 a. electroplating a conductive trace on an underlying surface;
 b. applying a first coat of a polyimide over the conductive trace and the underlying surface, leaving a surface that includes undulations and is non-planar;
 c. patterning the first coat of the polyimide to define portions of the polyimide that overlie the conductive trace;
 d. removing those portions of the polyimide, thereby exposing the conductive trace;
 e. applying a second coat of the polyimide over the first coat and over the conductive trace, the second coat at least partially dissolving and combining with the first coat, thereby leveling out the undulations in the first coat and leaving a substantially planar surface; and
 f. defining any vias that are required to electrically connect to the conductive trace.

11. The method of claim 10, further comprising steps (a) through (e) for each successive conductive layer that is built up to form the multi-layer circuit, wherein a successive conductive trace is applied to the substantially planar surface produced in step (e) and is electrically connected to the conductive trace exposed at each via.

12. The method of claim 10, wherein to form the first coating and the second coating, the polyimide is applied to a surface to be coated in a liquid form, and the surface is spun about an axis at a sufficient rotational speed so that centrifugal force spreads the polyimide to form the first and the second coats.

13. The method of claim 10, wherein to form the first coating and the second coating, the polyimide is sprayed in a liquid form onto a surface to be coated.

14. The method of claim 10, wherein the step of electroplating the conductive trace comprises the steps of depositing an electroplating seed layer onto the underlying surface, patterning the electroplating seed layer to define an area where the conductive trace is to be electroplated, and applying a photoresist layer on each side of the area to form a trench, the conductive trace thereafter being electroplated into the trench formed in the photoresist layer.

15. The method of claim 14, further comprising the step of removing a remaining portion of the electroplating seed layer not covered by the conductive trace.

16. The method of claim 14, further comprising the step of depositing an adhesion layer before depositing the electroplating seed layer.

17. The method of claim 10, further comprising the steps of curing the polyimide at an elevated temperature after each of the steps of applying the first and the second coats.

18. The method of claim 10, wherein the step of patterning the combined first and second coats of the polyimide comprises the steps of photolithographically patterning the polyimide to define areas that are to be removed, and steps of removing the polyimide each comprise the step of dissolving the polyimide away from those areas.

19. The method of claim 10, further comprisng the step of forming a passivating layer over the conductive trace before applying the first coat of the polyimide to prevent a chemical interaction between the conductive trace and the first coat of the polyimide.

20. The method of claim 10, further comprising the step of forming an adhesion layer over the substrate before applying the first coat of the polyimide.

* * * * *

UNITED STATES PATENT AND TRADEMARK OFFICE
CERTIFICATE OF CORRECTION

PATENT NO. : 5,149,615
DATED : September 22, 1992
INVENTOR(S) : K. K. Chakravorty et al.

It is certified that error appears in the above-identified patent and that said Letters Patent is hereby corrected as shown below:

| COLUMN | LINE | |
|---|---|---|
| [56] "Other Publications" | 9th Publ. | "IEEE Transactioins" should read --IEEE Transactions-- |
| 1 | 18 | "requirments" should read --requirements-- |
| 3 | 38 | "A" should read --Å-- |
| 4 | 52 & 53 | "machani-cally" should read --mechanically-- |
| 4 | 63 & 64 | "Cibe-Geigy" should read --Ciba-Geigy-- |
| 6 | 9 | "coating" should read --coatings-- |
| 7 (Claim 11, | 38 Line 1) | after "comprising" insert --repeating-- |
| 8 (Claim 18, | 33 Line 5) | after "and" insert --the-- |
| 8 (Claim 19, | 36 Line 1) | "comprisng" should read --comprising-- |

Signed and Sealed this

Ninth Day of November, 1993

Attest:

BRUCE LEHMAN

Attesting Officer

Commissioner of Patents and Trademarks